United States Patent
Rieh et al.

(10) Patent No.: US 7,989,868 B2
(45) Date of Patent: Aug. 2, 2011

(54) MOS VARACTOR AND FABRICATING METHOD OF THE SAME

(75) Inventors: Jae-Sung Rieh, Seoul (KR); Yong Ho Oh, Incheon (KR); Sue Yeon Kim, Daegu (KR); Seung Yong Lee, Busan (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 136 days.

(21) Appl. No.: 12/565,197

(22) Filed: Sep. 23, 2009

(65) Prior Publication Data

US 2010/0244113 A1  Sep. 30, 2010

(30) Foreign Application Priority Data

Mar. 27, 2009  (KR) .................. 10-2009-0026678

(51) Int. Cl.
*H01L 21/00* (2006.01)
(52) U.S. Cl. ......... 257/312; 257/E29.344; 257/E21.364; 438/379
(58) Field of Classification Search .................. 257/312, 257/E29.344, E21.364; 438/379
See application file for complete search history.

(56) References Cited

U.S. PATENT DOCUMENTS

| | | | |
|---|---|---|---|
| 7,091,797 B2 * | 8/2006 | Takamatsu | 331/177 V |
| 7,276,746 B1 * | 10/2007 | Xu et al. | 257/258 |
| 2003/0067026 A1 * | 4/2003 | Bulucea | 257/303 |
| 2007/0007342 A1 * | 1/2007 | Cleeves et al. | 235/435 |

FOREIGN PATENT DOCUMENTS

EP  1981087 A2  10/2008

OTHER PUBLICATIONS

I. Gutierrez et al., "MOS Varactors", in "Design and Characterization of Integrated Varactors for RF Application", 2006, John Wiley & Sons, Chapter 3, pp. 32-52.*

* cited by examiner

*Primary Examiner* — Thomas L Dickey
*Assistant Examiner* — Nikolay Yushin
(74) *Attorney, Agent, or Firm* — Rabin & Berdo, PC

(57) ABSTRACT

A MOS varactor for use in circuits and elements of a millimeter-wave frequency band, which is capable of reducing series resistance and enhancing a Q-factor by using a plurality of island-like gates seated in a well region of a substrate and gate contacts directly over the gates, includes: gate insulating layers arranged at equal intervals in the form of a (n×m) matrix, and a gate electrode placed on the gate insulating layers in a well region of a substrate; a gate contact which contacts the gate electrode; a first metal wire, which is electrically connected to the gate contact; source/drain contacts arranged at equal intervals in a matrix to form apexes of a square centered at the gate electrode and contact a doping region except for the bottom of the gate insulating layers; and a second metal wire, which is electrically connected to the source/drain contacts.

19 Claims, 7 Drawing Sheets

MOS VARACTOR AND FABRICATING METHOD OF THE SAME

BACKGROUND OF THE INVENTION

1. Field of the Invention

The present invention relates to a MOS varactor. More particularly, the present invention relates to a MOS varactor for use in circuits and elements of a millimeter-wave frequency band, which is capable of reducing series resistance and enhancing a Q-factor by using a plurality of island-like gates seated in a well region of a substrate and gate contacts directly over the gates, and a method of fabricating the MOS varactor.

2. Description of the Related Art

In pace with recent general trend to information-orientation, many efforts have been made to achieve high speed and high frequencies in the field of wireless communication for high quality wide-band communication services. In this connection, achievement of high integration, high frequency and low noise characteristics of CMOS (Complementary Metal-Oxide Semiconductor) process-based semiconductor devices for RFIC (Radio Frequency Integrated Circuit) has been raised as a major issue.

A CMOS process-based semiconductor device has been conventionally recognized as core technology for implementation of RFIC of a millimeter wave frequency band (30 GHz to 300 GHz) because of its on-chip ability and excellent merits in the aspect of production costs and power consumption and has been increasingly significant, particularly, with extension of a RFIC application range up to a frequency band of 60 GHz or 77 GHz in recent years.

In the meantime, as an operation frequency of RFIC using the CMOS process-based semiconductor device is increasing, performance of not only active elements such as transistors and so on but also passive elements such as inductors, varactors, capacitors and so on in the semiconductor device acts as a primary factor to have a great effect on the entire operation characteristic of a system.

As one example, a voltage-controlled oscillator (VCO) for generating a carrier frequency of a transceiver of a millimeter wave frequency band has a phase noise as its most important characteristic on which a Q (quality) factor of an LC tank including an inductor and a varactor makes core contribution. In this case, although performance deterioration may be mainly problematic as a Q factor of the inductor decides a Q factor of the entire LC tank in a relatively low frequency band of several GHz, the Q factor of the inductor trends to be relatively enhanced while a Q factor of the varactor trends to be rapidly decreased with increase of an operation frequency. As a result, in the millimeter wave frequency band, the Q factor of the varactor acts as a primary factor to have an effect on the entire performance of the LC tank and VCO.

MOS varactor having a so-called multi-finger structure in which stripe-shaped gate electrodes are interdigitated has been mainly used up to recently due to its compatibility with the CMOS device structure. However, such a structure has a fatal drawback in that it suffers from large parasitic resistance leading a low Q factor thereby degrading the performance of the LC tank and VCO that employ the device.

SUMMARY OF THE INVENTION

To overcome the above problem, it is an object of the present invention to provide a MOS varactor with more improved characteristics. In other words, an object of the present invention is to provide a MOS varactor for use in circuits and elements of a millimeter wave frequency band, which has low series resistance and an enhanced Q-factor as compared to a MOS varactor having a multi-finger structure.

To the end, the present invention provides a MOS varactor which is capable of reducing series resistance, which may be caused by channel resistance and contact resistance, and enhancing a Q-factor by using a plurality of island-like gates seated in a well region of a substrate and gate contacts directly over the gates, and a method of fabricating the MOS varactor.

To achieve the above object, according to an aspect of the invention, there is provided a MOS varactor including: island-like gate insulating layers which are arranged at equal intervals in the form of a (n×m) matrix (where, n and m are integers equal to or larger than one), and a gate electrode of a first height (t1) placed on the gate insulating layers in a well region of a substrate; a gate contact which contacts the gate electrode; a first metal wire of a second height (t2) (where, t1<t2), which is electrically connected to the gate contact; source/drain contacts which are arranged at equal intervals in a [(n+1)×(m+1)] matrix to form apexes of a square centered at the gate electrode and contact a doping region except for the bottom of the gate insulating layers; and a second metal wire of a third height (t3) (where, t2<t3), which is electrically connected to the source/drain contacts.

Preferably, the gate electrode has a polygon shape including a square or a circle shape and is made of one selected from a group consisting of polysilicon, silicided polysilicon and metal.

Preferably, the MOS varactor further includes a first insulating layer which is interposed between the substrate and the first metal wire, covers the gate insulating layers and the gate electrode, and is configured to provide first contact holes connected to the gate electrode and second contact holes connected to the doping region, and the gate contact contacts the gate electrode via the first contact holes.

Preferably, the MOS varactor further includes a second insulating layer which is interposed between the first insulating layer and the second metal wire and is configured to provide third contact holes connected respectively to the second contact holes, and the source/drain contacts contact source/drain regions, respectively, via the second and third contact holes.

Preferably, the MOS varactor further includes a plug of the second height (t2), which is interposed between the second contact holes and the third contact holes and is vertically connected to the source/drain contacts.

Preferably, the first metal wire and the plug are made of the same material.

Preferably, the MOS varactor further includes an interlayer dielectric to provide first damascene holes for the first metal wire and the plug, which is interposed between the first insulating layer and the second insulating layer.

Preferably, the first metal wire and the plug are made of copper (Cu).

Preferably, the MOS varactor further includes a third insulating layer which covers the second insulating layer to provide second damascene holes for the second metal wire.

Preferably, the second metal wire is made of copper (Cu).

According to another aspect of the invention, there is provided a method of fabricating a MOS varactor, comprising the steps of: (a) forming a well region on a substrate and forming island-like gate insulating layers and a gate electrode over the gate insulating layers at equal intervals in the form of a (n×m) matrix (where, n and m are integers equal to or larger than one) in the well region; (b) forming a doping region on the substrate except for the bottom of the gate insulating layers and depositing a first insulating layer covering the gate electrode; (c) forming first contact holes connected to the gate electrode and second contact holes connected to the doping region on the first insulating layer, the second contact holes being arranged at equal intervals in a [(n+1)×(m+1)] matrix to form apexes of a square centered at the gate electrode; (d) forming a gate contact with which the first contact holes are filled, a first source/drain contact with which the second contact holes are filled, and a first metal wire connected to the gate contact above the first insulating layer; (e) depositing a second insulating layer which covers the first metal wire; (f) forming third contact holes connected to the first source/drain contact on the second insulating layer; and (g) forming a second source/drain contact with which the third contact holes are filled, and a second metal wire connected to the second source/drain contact above the second insulating layer.

Preferably, the step (d) includes (d1) forming the gate contact and the first source/drain contact after the step (c) and (d2) forming the first metal wire after the step (d1).

Preferably, the step (d2) further includes forming a plug to be connected to the first source/drain contact and the second source/drain contact above the first insulating layer, the plug being made of the same material as the first metal wire.

Preferably, the method of fabricating a MOS varactor further includes depositing an interlayer dielectric on the first insulating layer and forming first damascene holes for the first metal wiring and the plug after the step (d1) and before the step (d2).

Preferably, the first metal wire is made of copper (Cu).

Preferably, the step (g) includes (g1) forming the second source/drain contact after the step (f) and (g2) forming the second metal wire after the step (g1).

Preferably, the method of fabricating a MOS varactor further includes depositing a third insulating layer on the second insulating layer and forming second damascene holes for the second metal wiring after the step (g1) and before the step (g2).

Preferably, the second metal wire is made of copper (Cu).

Preferably, the gate electrode has a polygon shape including a square or a circle shape and is made of one selected from a group consisting of polysilicon, silicided polysilicon and metal.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENT

Hereinafter, preferred embodiments of the present invention will be described in detail with reference to the accompanying drawings.

Prior to the detailed description, it is to be understood that the description and figures mentioned in the specification show the main technical spirit of the present invention, and various structures and techniques known in the art, which may be applied to the present invention based on the main technical spirit of the present invention, are described in brief as possible as they may make the gist of the present invention obscure. However, it is appreciated that such structures and techniques known in the art are apparent to those skilled in the art through the following description.

Figure 1:
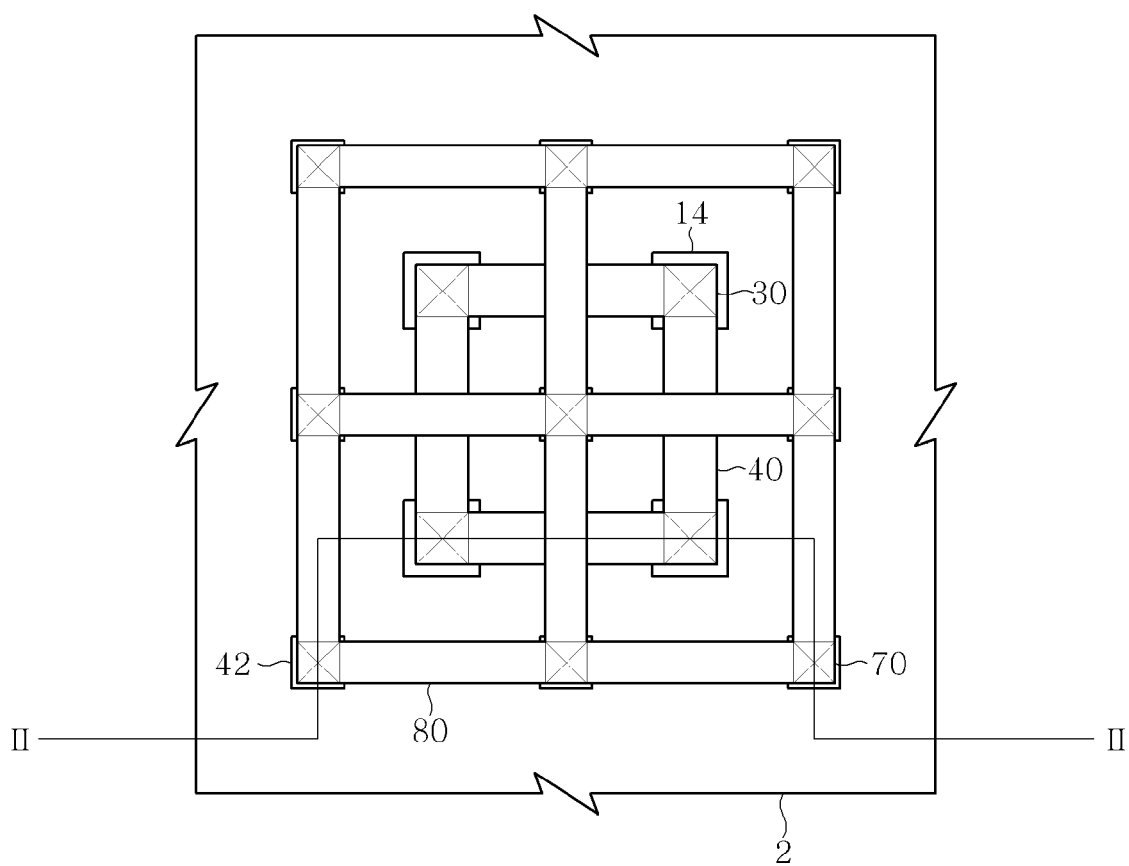
FIG. 1 is a schematic plan view showing a MOS varactor according to an embodiment of the present invention.
Figure 2:
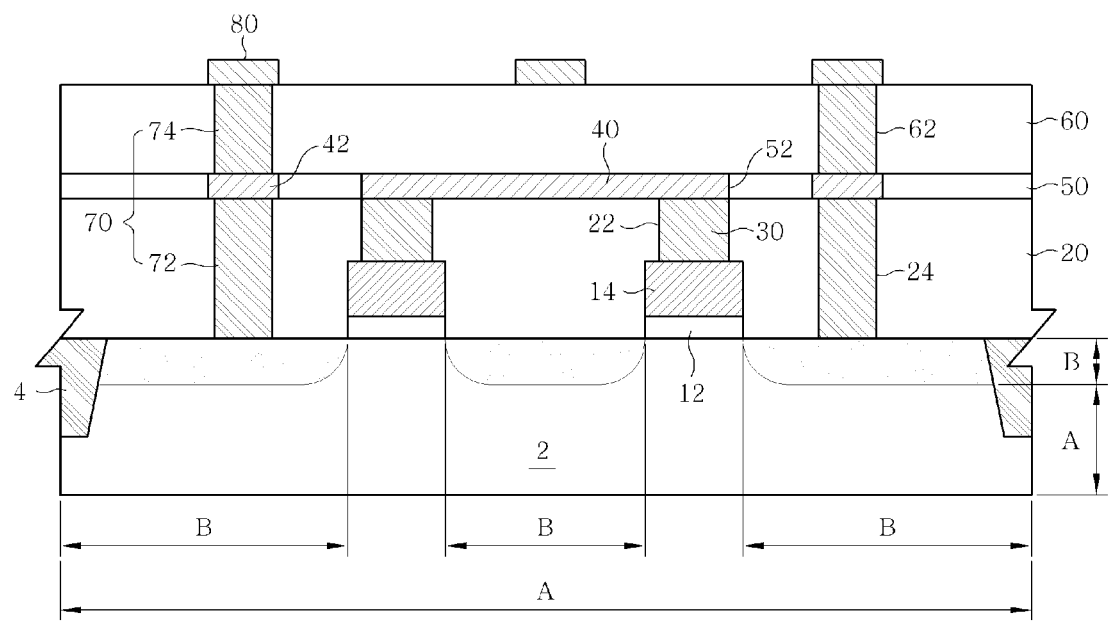
FIG. 2 is a schematic sectional view taken along line II-II of FIG. 1.

FIG. 1 is a schematic plan view showing a MOS varactor according to an embodiment of the present invention, and FIG. 2 is a schematic sectional view taken along line II-II of FIG. 1.

As shown, a MOS varactor according to an embodiment of the present invention has a structure in which one or more gate electrodes 14 are arranged at regular intervals along a well region of a substrate 2 and are connected to a first metal wire 40 via gate contacts 30, and source/drain contacts 70 playing a role as substantial source/drain electrodes for the gate electrodes 14 are arranged at regular intervals along a doping region on the substrate 2 and are connected to a second metal wire 80.

Particularly, the gate electrodes 14 have an island shape and are arranged at equal intervals in the form of a (n×m) matrix (where, n and m are integers equal to or larger than one) in the well region of the substrate 2 and the source/drain contacts 70 are arranged at equal intervals in the form of a [(n+1)×(m+1)] matrix in the doping region of the substrate 2 except for a lower end of a gate insulating layer 12, which correspond to four apexes of a square centered at any gate electrode 14.

Now, each of the elements will be described in more detail.

First, the substrate 2 of the MOS varactor of the present invention is a silicon (Si) wafer for providing a separate space isolated from other elements by device isolation layers 4.

The separate space forms a well region A of a first conductivity type. In the space, doping regions B of a second conductivity type are also formed at a predetermined depth in a surface of the substrate 2 except for the lower end of the gate insulating layer 12. For reference, the MOS varactor of the present invention has an accumulation mode if the first conductivity is an N type and the second conductivity type is an N+ type, while it has a depletion mode or an inversion mode if the first conductivity is an N+ type and the second conductivity type is an N type.

In addition, one or more gate insulating layers 12 and gate electrodes 14 thereabove are arranged in the shape of an island in the well region A of the substrate 2.

Here, the gate insulating layer 12 and the gate electrodes 14 have a polygonal shape including identical circular shapes or square shapes and are arranged at equal intervals in the form of a (n×m) matrix (where, n and m are integers equal to or larger than one) in the well region A of the substrate 2. Accordingly, it can be seen that FIGS. 1 and 2 show an example where the gate insulating layers 12 and the gate electrodes 14 are arranged in the form of a (2×2) matrix. Preferably, the gate insulating layers 12 and the gate electrodes 14 are arranged with the shape of a square at equal intervals along a matrix direction, as shown in the figures.

The gate contacts 30 are connected to the gate electrodes 14, respectively, and are electrically connected to the first metal wire 40 at a position higher than the gate electrodes 14.

For example, if the height of the gate electrodes 14 is t1, the height of the first metal wire 40 is t2 (t1<t2). To this end, a first insulating layer 20 covering the gate insulating layer 12 and the gate electrodes 14 are interposed between the substrate 2 and the first metal wire 40. Accordingly, the first insulating layer 12 acts as an underlying layer for supporting the first metal wire 40 and provides first contact holes 22 for the gate contacts 30 and second contact holes 24 for the source/drain contacts 70, which will be described later, with the first contact holes 22 filled with the gate contacts 30 and the second contact holes 24 filled with first source/drain contacts 72 as a portion of the source/drain contacts 70.

In addition, the first metal wire 40 electrically interconnecting the gate contacts 30 is formed on the first insulating layer 20, and plugs 42 made of the same material as the first metal wire 40 and electrically connected to the first source/drain contacts 72 are formed at the same height as the first metal wire 40.

The source/drain contacts 70 contact the doping region B of the substrate 2.

At this time, the source/drain contacts 70 contact the doping region B via the second contact holes 24 of the first insulating layer 20, are arranged at equal intervals in the form of a [(n+1)×(m+1)] matrix, and occupy positions corresponding to apexes of apexes of a square centered at each gate insulating electrode 14. Accordingly, it can be seen that FIGS. 1 and 2 show an example where the source/drain contacts 70 are arranged in the form of a (3×3) matrix. In addition, as shown in the figures, four source/drain contacts 70 for any gate electrode 14 are placed at positions corresponding to apexes of a square centered at the corresponding gate electrodes 14.

The source/drain contacts 70 are electrically connected to the second metal wire 80 placed at the height of t3 (t3>t2).

For the above configuration, a second insulating layer covering the first metal wire 40 is interposed between the first insulating layer 20 and the second metal wire 80. The second insulating layer 60 plays a role as an underlying layer for supporting the second metal wire 80 and is provided therein with third contact holes 62 for the source/drain contacts 70.

Accordingly, the third contact holes 62 are filled with second source/drain contacts 74 which are a remainder of the source/drain contacts 70. The second/drain contacts 74 are connected to the first source/drain contacts via the plug 42, and the second metal wire 80 electrically connected to the source/drain contacts 70 is positioned over the second insulating layer 60.

On the other hand, an insulating side wall may be formed on the outer sides of the gate insulating layer 12 and the gate electrode 14, and separate metal silicide may be formed at positions in the doping region B of the substrate 2 with which the source/drain contacts 70 contact.

This is apparent to those skilled in the art without a separate figure.

In addition, it is preferable that the first metal wire 40 and the second metal wire 80 of the MOS varactor of the present invention are made of different materials. As an example, the first metal wire 40 is made of copper (Cu) while the second metal wire 80 is made of aluminum (Al), or alternatively, the first metal wire 40 is made of aluminum (Al) while the second metal wire 80 is made of copper (Cu).

In the former, as shown in FIG. 2, a separate interlayer dielectric 50 may be interposed between the first and second insulating layers 20 and 60 and may be provided therein with a first damascene hole 52 for the first metal wire 40 and the plug 42. In the latter, as shown in FIG. 12, a separate third insulating layer 90 may be formed on the second insulating layer 60 and may be provided therein with a second damascene hole 92 for the second metal wire 80.

Figure 12:
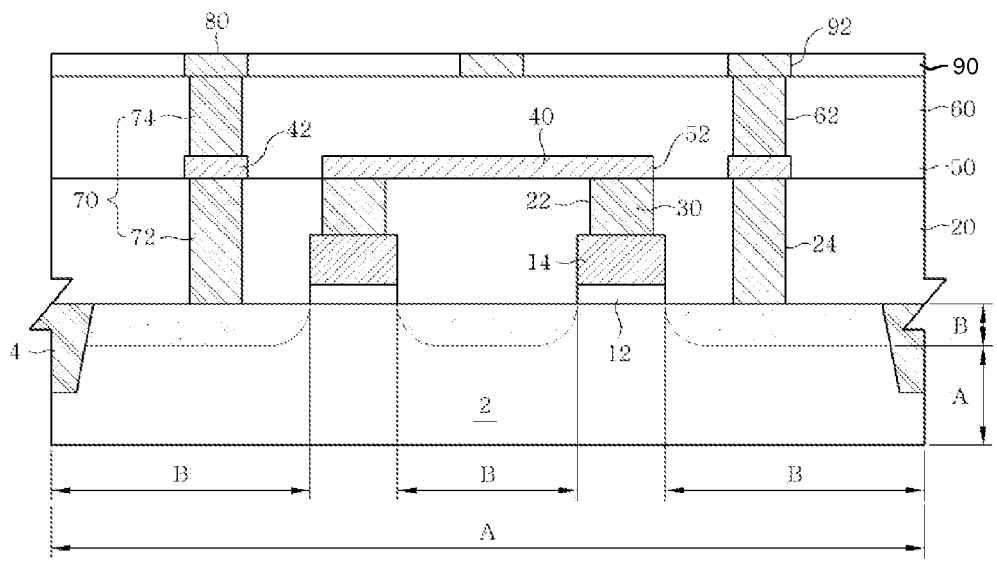
FIG. 12 is a schematic sectional view showing a modification of the MOS varactor according to the embodiment of the present invention.

FIG. 12 is a schematic sectional view showing a modification of the MOS varactor according to the embodiment of the present invention. As well known in the art, copper is very hard to be patterned with normal methods due to its nonvolatile property.

Accordingly, if the first metal wire 40 is made of copper, as shown in FIG. 2, the interlayer dielectric 50 is interposed between the first insulating layer 20 and the second insulating layer 60 and is provided therein with the first damascene hole 52 for the first metal wire 40 and the plug 42. If the first metal wire 80 is made of copper, as shown in FIG. 12, the third insulating layer 90 is further formed on the second insulating layer 60 and is be provided therein with the second damascene hole 92 for the second metal wire 80.

This is apparent to those skilled in the art without a further description.

As a result, the MOS varactor of the present invention is capable of decreasing the channel resistance through the island-like gate electrodes 14 formed in the well region A of the substrate 2 while decreasing the contact resistance through the gate contacts 30 over the gate electrodes 14, thereby decreasing the series resistance and hence enhancing the Q factor.

Hereinafter, a method of manufacturing the MOS varactor of the present invention will be described.

FIGS. 3 to 11 are schematic sectional views for explaining processes of fabricating the MOS varactor of the present invention. These processes will be described with reference to FIGS. 3 to 11 along with FIGS. 1, 2 and 12.

Figure 3:
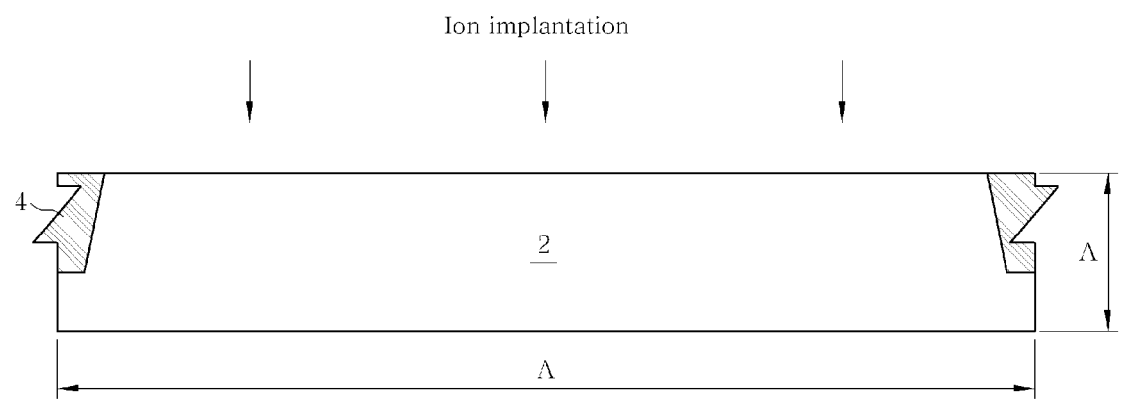
FIG. 3 is a schematic sectional view for explaining a process of fabricating a MOS varactor according to an embodiment of the present invention.

In manufacturing the MOS varactor of the present invention, as shown in FIG. 3, first, the substrate 2 is prepared, the well region A and the element isolation layer 4 are formed on a surface of the substrate 2 through ion implantation of a first conductivity type and annealing, thereby defining a separate region electrically isolated from other elements.

For reference, the element isolation layer may be formed with a trench by etching a portion of the substrate and may be obtained through shallow trench isolation (STI) for filling the trench with oxide dielectric and subsequent densification and planarization.

Figure 4:
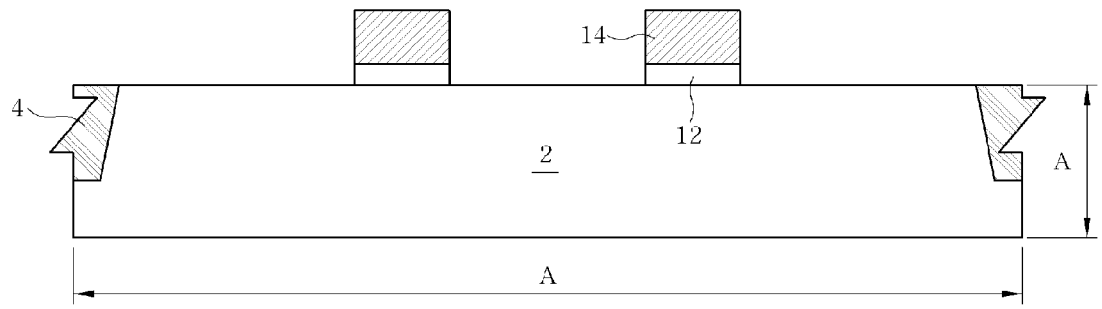
FIG. 4 is a further schematic sectional view for explaining the process according to the embodiment of the present invention.

Next, as shown in FIG. 4, a plurality of gate insulating layers 12 and the gate electrode 14 over the gate insulating layers 12 are implemented in the form of an island at equal intervals so that they are formed in the form of a (n×m) matrix (where, n and m are integers equal to or larger than one) in the well region A of the substrate 2.

At this time, in order to obtain the gate insulating layer 12 and the gate electrode 14, an insulating material for the gate insulating layer 12 and one selected from predetermined materials, for example, polysilicon, silicided polysilicon and metal, for the gate electrode 14 are thin film-deposited in turn on the entire surface of the substrate 2, and then are photolithographed and etched. As a result, the gate insulating layer 12 and the gate electrode 14 thereabove, which are in a polygonal shape including a square or a circle shape, are obtained.

For reference, a photolithography refers to a series of processes for patterning a thin film and generally includes processes for obtaining a photoresist pattern to selectively expose a portion of the thin film by applying photoresist, which is a photosensitive material, on the thin film, exposing the thin film using the photoresist as a mask and developing the thin film with a developer. Accordingly, through the photolithography followed by etching, a portion of the exposed thin film is removed to pattern the thin film. In the specification, this is intended to encompass stripping and cleaning to remove a residual photoresist pattern after the etching. This has the consistently identical meaning throughout the specification.

Figure 5:
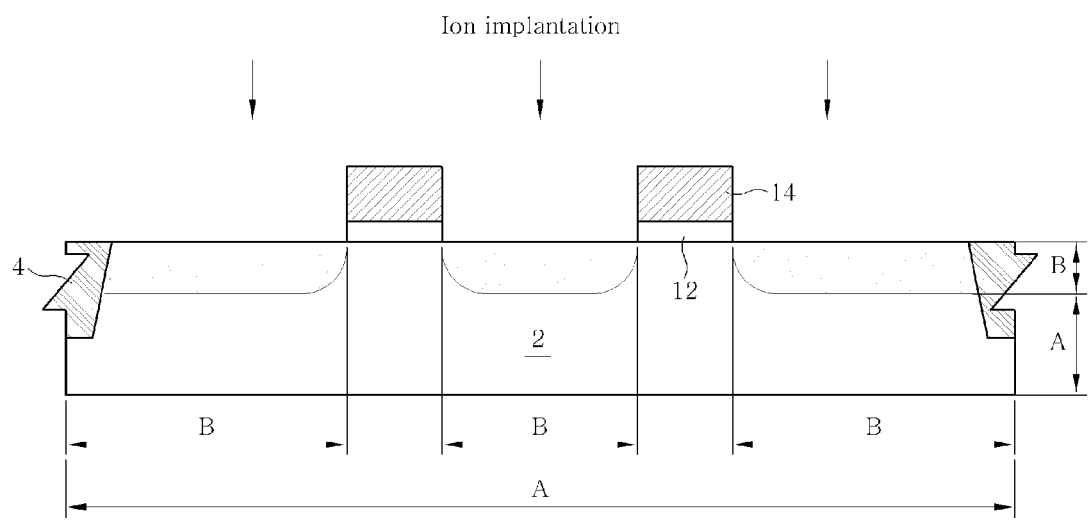
FIG. 5 is a further schematic sectional view for explaining the process according to the embodiment of the present invention.

Next, as shown in FIG. 5, the doping region B is formed on the entire surface of the substrate 2 on which the gate insulating layer 12 and the gate electrode 14 are formed, through ion implantation of a second conductivity type and annealing. Thus, a surface of the substrate 2 except for the bottom of the gate insulating layer 12 becomes a doping region of a predetermined depth (for convenience' sake, the well region A and the doping region B are not separately shown in the following figures).

Figure 6:
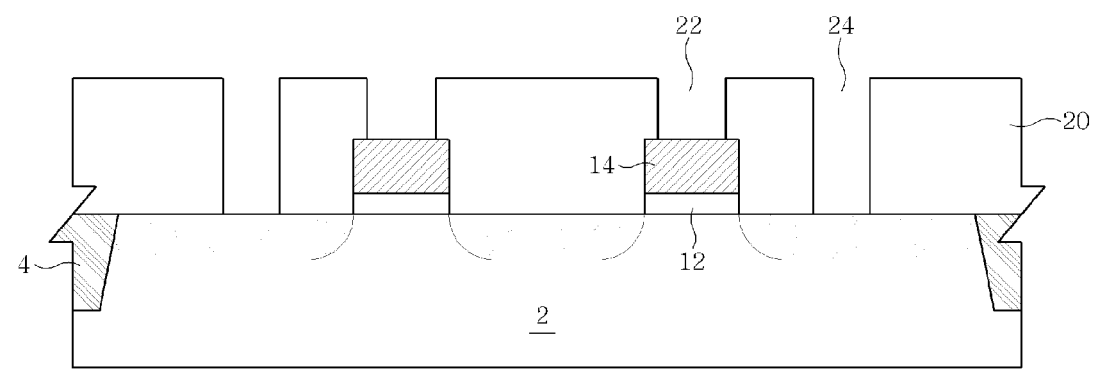
FIG. 6 is a further schematic sectional view for explaining the process according to the embodiment of the present invention.

Next, as shown in FIG. 6, the first insulating layer 20 is deposited on the entire surface of the substrate 2 to cover the gate insulating layer 12 and the gate electrode 14 and then is provided therein with the first contact holes 22 connected to the gate electrode 12 and the second contact holes 24 arranged at equal intervals in the form of a [(n+1)×(m+1)] matrix and connected to the doping region B at positions corresponding to apexes of a square centered at any gate electrode 12 through photolithography followed by etching.

Figure 7:
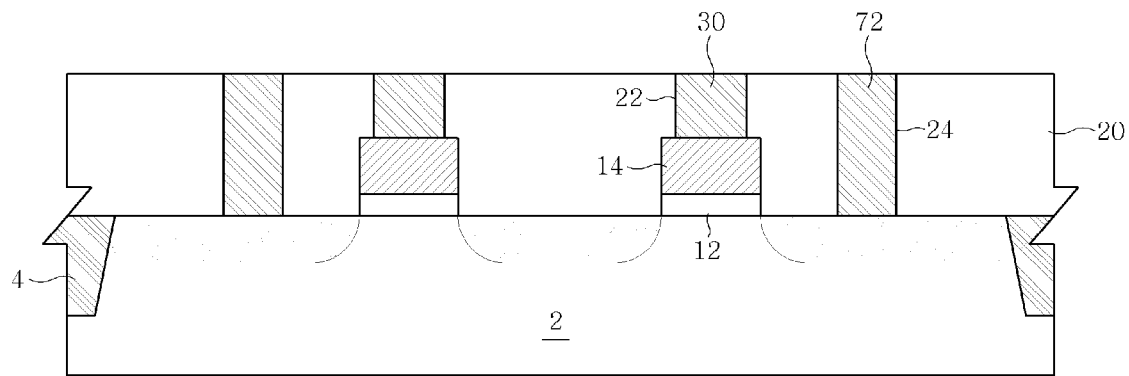
FIG. 7 is a further schematic sectional view for explaining the process according to the embodiment of the present invention.

Next, as shown in FIG. 7, a metal material such as tungsten is deposited on the entire surface of the substrate 2 on which the first insulating layer 20 is formed, and then a residual material existing out of the first and second contact holes 22 and 24 is removed through chemical mechanical polishing (CMP).

Thus, the first contact holes 22 are filled with the gate contact 30 to be connected to the gate electrode 14 and the second contact holes 24 are filled with the first source/drain contact 72 to be connected to the doping region B.

Figure 8:
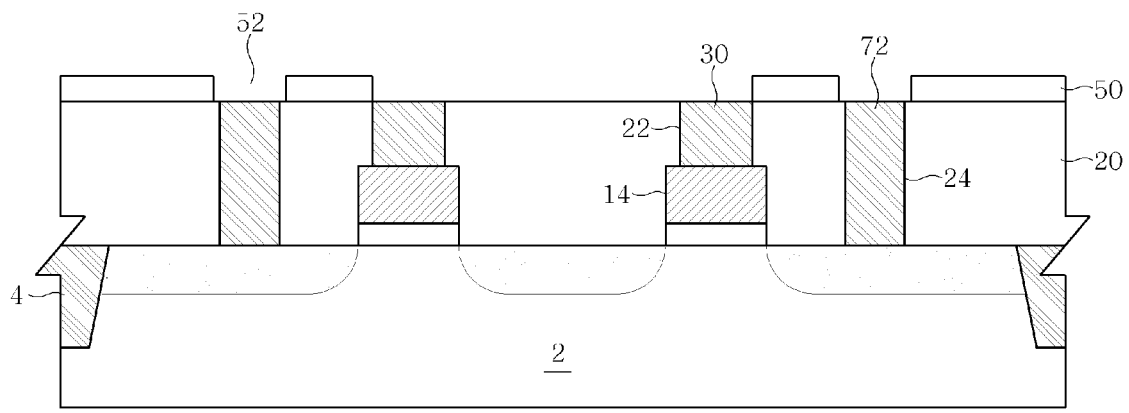
FIG. 8 is a further schematic sectional view for explaining the process according to the embodiment of the present invention.

Next, as shown in FIG. 8, the interlayer dielectric 50 is deposited on the entire surface, and then the first damascene holes 52 are formed in the interlayer dielectric through photolithography followed by etching to expose the gate contact 30 and the first source/drain contact 72.

Figure 9:
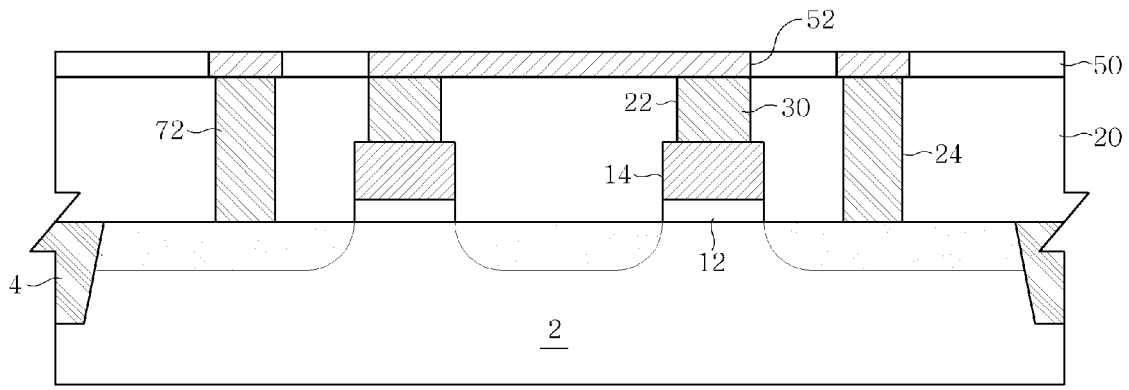
FIG. 9 is a further schematic sectional view for explaining the process according to the embodiment of the present invention.

Next, as shown in FIG. 9, copper is deposited on the entire surface of the substrate 2 on which the interlayer dielectric 50 is formed, and then the first metal wire 40 and the plug 42 are implemented through chemical mechanical polishing.

Thus, the gate electrode 14 is electrically connected to the first metal wire 40 via the gate pattern 30.

For reference, FIGS. 8 and 9 show a case where the first metal wire 40 and the plug 42 are made of copper, but alternatively if they are made of aluminum, instead of the interlayer dielectric 50, aluminum is deposited on the first insulating layer 20 after the process shown in FIG. 7, and then the first metal wire 40 and the plug 42 may be implemented through photolithography followed by etching. This has been earlier discussed and will be easily understood with reference to FIG. 12.

Figure 10:
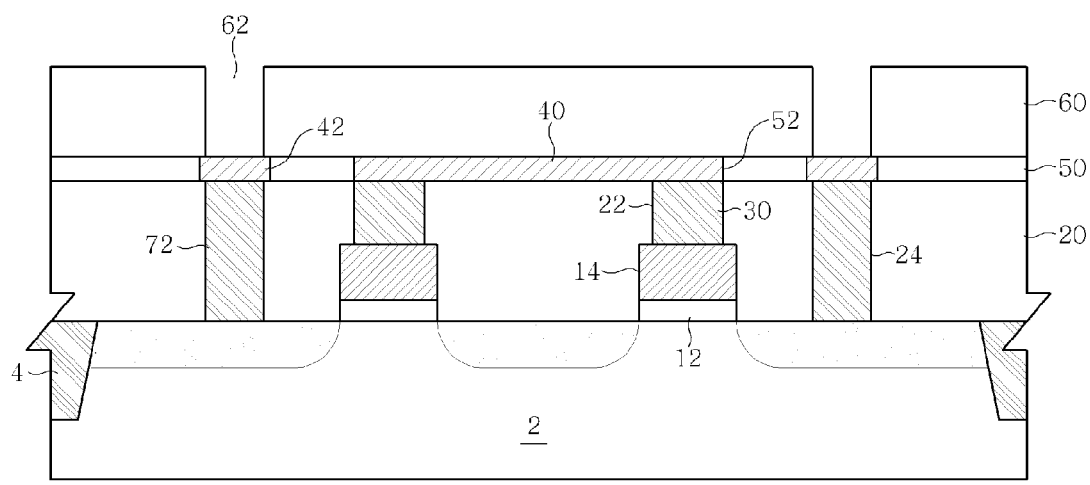
FIG. 10 is a further schematic sectional view for explaining the process according to the embodiment of the present invention.

Next, as shown in FIG. 10, the second insulating layer 60 is deposited on the entire surface, and then the third contact holes 62 to be connected to the plug 52 are formed through photolithography followed by etching.

Figure 11:
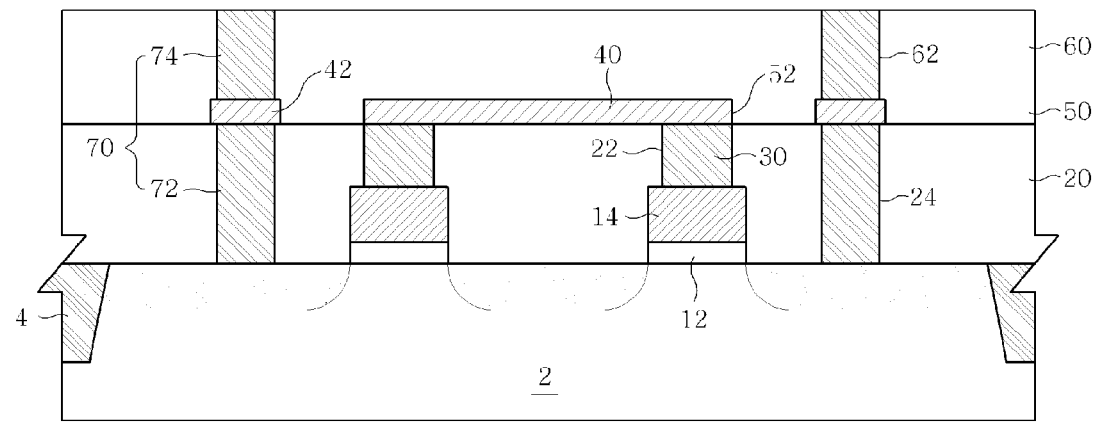
FIG. 11 is a further schematic sectional view for explaining the process according to the embodiment of the present invention.

Next, as shown in FIG. 11, a metal material such as tungsten is deposited on the entire surface and then is subjected to chemical mechanical polishing to obtain the second source/drain contact 74 with which the third contact holes 62 are filled.

Finally, a metal material such as aluminum is deposited on the second insulating layer 60, and then the second metal wire 80 to be connected to the source/drain contact 70 is obtained through photolithography followed by etching, thereby completing the MOS varactor of the present invention as shown in FIGS. 1 and 2.

For reference, as shown in FIG. 12, if the second metal wire 80 is made of copper, the source/drain contact 70 is implemented through the processes shown in FIGS. 1 to 11, the third insulating layer 90 is formed on the second insulating layer 60, and the second damascene holes 92 to be connected to the source/drain contact 70 are formed through photolithography followed by etching. Subsequently, copper is deposited on the third insulating layer 90 and then is subjected to chemical mechanical polishing, thereby completing the second metal wire 80.

Figure 13:
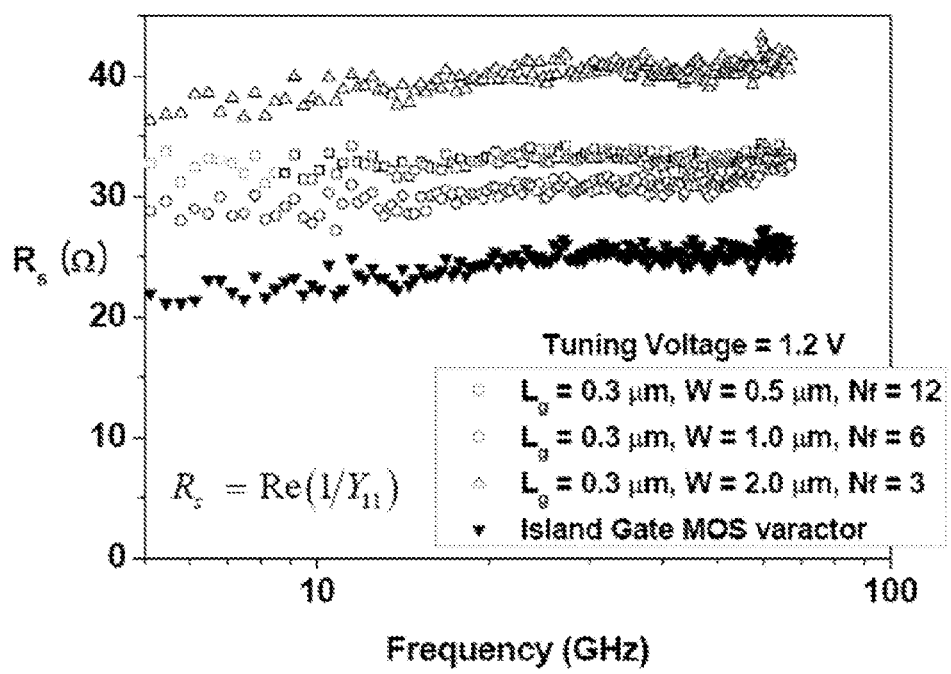
FIG. 13 is a graph showing a comparison of series resistance between a MOS varactor of the present invention and a conventional MOS varactor.
Figure 14:
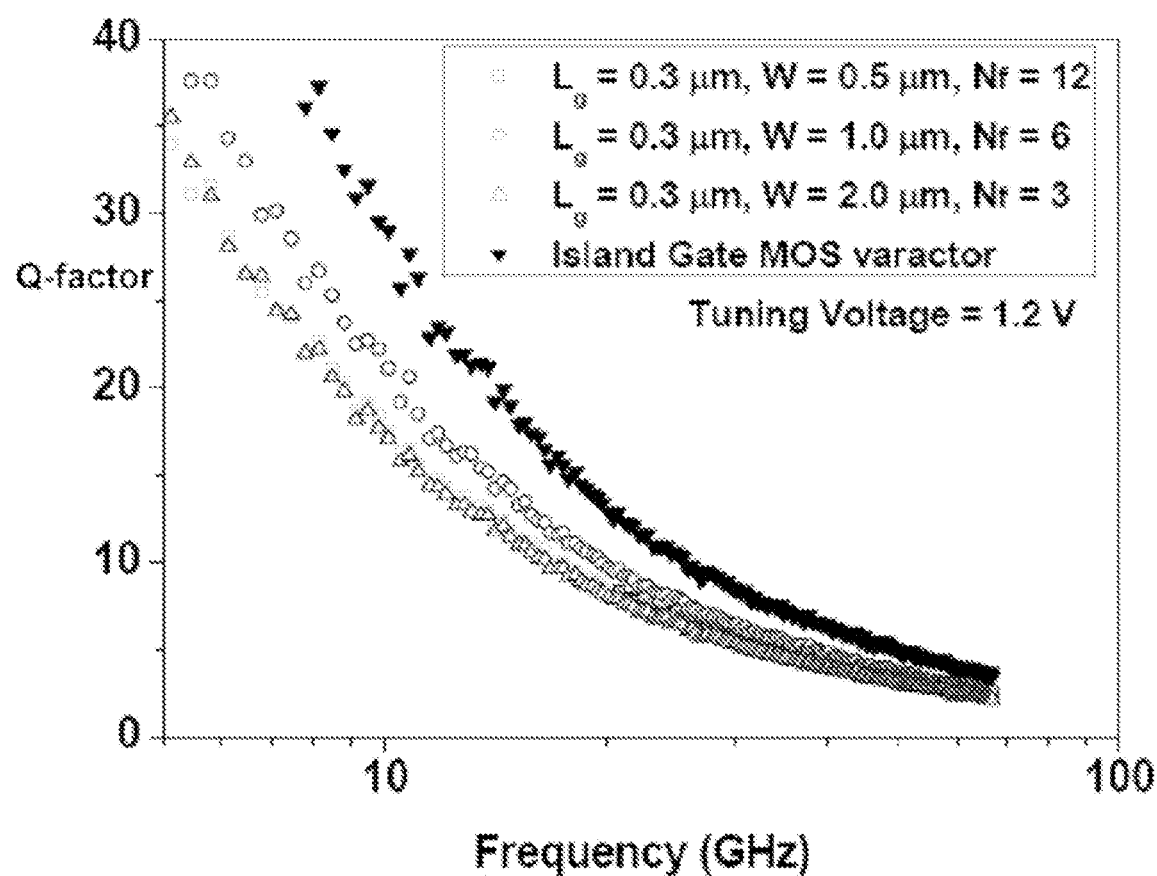
FIG. 14 is a graph showing a comparison of Q factor between a MOS varactor of the present invention and a conventional MOS varactor.

FIGS. 13 and 14 are graphs showing a comparison of series resistance and Q factor, respectively, between the MOS varactor of the present invention and a conventional multi-finger-structured varactor.

In the shown graphs, values indicated by ▼ show the MOS varactor of the present invention in which the gate insulating layer 12 and the gate electrode 14 have a square shape, while values indicated by ∆, □, ○ show a conventional multi-finger-structured varactor. It can be seen from the shown graphs that the MOS varactor of the present invention provides low series resistance and enhanced Q factor over the entire frequency band of 1 to 100 GHz.

While the present invention has been particularly shown and described with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. A MOS varactor comprising:
   island-like gate insulating layers which are arranged at equal intervals in the form of a (n×m) matrix (where, n and m are integers equal to or larger than one), and a gate electrode placed on the gate insulating layers in a well region of a substrate;

a gate contact which contacts the gate electrode;

a first metal wire, which is electrically connected to the gate contact;

source/drain contacts which are arranged at equal intervals in a [n+1]×(m+1)] matrix to form apexes of a square centered at the gate electrode and contact a doping region except for the bottom of the gate insulating layers; and a second metal wire, which is electrically connected to the source/drain contacts.

2. The MOS varactor according to claim 1, wherein the gate electrode has a polygon shape including a square or a circle shape and is made of one selected from a group consisting of polysilicon, silicided polysilicon and metal.

3. The MOS varactor according to claim 1, further comprising a first insulating layer which is interposed between the substrate and the first metal wire, covers the gate insulating layers and the gate electrode, and is configured to provide first contact holes connected to the gate electrode and second contact holes connected to the doping region, wherein the gate contact contacts the gate electrode via the first contact holes.

4. The MOS varactor according to claim 3, further comprising a second insulating layer which is interposed between the first insulating layer and the second metal wire and is configured to provide third contact holes connected respectively to the second contact holes, wherein the source/drain contacts contact source/drain regions, respectively, via the second and third contact holes.

5. The MOS varactor according to claim 4, further comprising a plug, which is interposed between the second contact holes and the third contact holes and is vertically connected to the source/drain contacts.

6. The MOS varactor according to claim 5, wherein the first metal wire and the plug are made of the same material.

7. The MOS varactor according to claim 5, further comprising an interlayer dielectric to provide first damascene holes for the first metal wire and the plug, which is interposed between the first insulating layer and the second insulating layer.

8. The MOS varactor according to claim 7, wherein the first metal wire and the plug are made of copper (Cu).

9. The MOS varactor according to claim 5, further comprising a third insulating layer which covers the second insulating layer to provide second damascene holes for the second metal wire.

10. The MOS varactor according to claim 9, wherein the second metal wire is made of copper (Cu).

11. A method of fabricating a MOS varactor, comprising the steps of:

(a) forming a well region on a substrate and forming island-like gate insulating layers and a gate electrode over the gate insulating layers at equal intervals in the form of a (n×m) matrix (where, n and m are integers equal to or larger than one) in the well region;

(b) forming a doping region on the substrate except for the bottom of the gate insulating layers and depositing a first insulating layer covering the gate electrode;

(c) forming first contact holes connected to the gate electrode and second contact holes connected to the doping region on the first insulating layer, the second contact holes being arranged at equal intervals in a [n+1]×(m+1)] matrix to form apexes of a square centered at the gate electrode;

(d) forming a gate contact with which the first contact holes are filled, a first source/drain contact with which the second contact holes are filled, and a first metal wire connected to the gate contact above the first insulating layer;

(e) depositing a second insulating layer which covers the first metal wire;

(f) forming third contact holes connected to the first source/drain contact on the second insulating layer; and (g) forming a second source/drain contact with which the third contact holes are filled, and a second metal wire connected to the second source/drain contact above the second insulating layer.

12. The method according to claim 11, wherein the step (d) includes (d1) forming the gate contact and the first source/drain contact after the step (c) and (d2) forming the first metal wire after the step (d1).

13. The method according to claim 12, wherein the step (d2) further includes forming a plug to be connected to the first source/drain contact and the second source/drain contact above the first insulating layer, the plug being made of the same material as the first metal wire.

14. The method according to claim 13, further comprising depositing an interlayer dielectric on the first insulating layer and forming first damascene holes for the first metal wiring and the plug after the step (d1) and before the step (d2).

15. The method according to claim 14, wherein the first metal wire is made of copper (Cu).

16. The method according to claim 11, wherein the step (g) includes (g1) forming the second source/drain contact after the step (f) and (g2) forming the second metal wire after the step (g1).

17. The method according to claim 16, further comprising depositing a third insulating layer on the second insulating layer and forming second damascene holes for the second metal wiring after the step (g1) and before the step (g2).

18. The method according to claim 17, wherein the second metal wire is made of copper (Cu).

19. The method according to claim 11, wherein the gate electrode has a polygon shape including a square or a circle shape and is made of one selected from a group consisting of polysilicon, silicided polysilicon and metal.

* * * * *